(12) United States Patent
Baleras et al.

(10) Patent No.: US 8,159,076 B2
(45) Date of Patent: Apr. 17, 2012

(54) METHOD OF PRODUCING A VIA IN A RECONSTITUTED SUBSTRATE

(75) Inventors: Francois Baleras, Saint Georges de Commiers (FR); Jean-Charles Souriau, Saint Egreve (FR); David Henry, Meylan (FR)

(73) Assignee: Commissariat a l'Energie Atomique, Paris (FR)

( * ) Notice: Subject to any disclaimer, the term of this patent is extended or adjusted under 35 U.S.C. 154(b) by 26 days.

(21) Appl. No.: 12/663,099

(22) PCT Filed: Jun. 5, 2008

(86) PCT No.: PCT/EP2008/057004
§ 371 (c)(1),
(2), (4) Date: Dec. 4, 2009

(87) PCT Pub. No.: WO2008/155233
PCT Pub. Date: Dec. 24, 2008

(65) Prior Publication Data
US 2010/0171227 A1 Jul. 8, 2010

(30) Foreign Application Priority Data
Jun. 7, 2007 (FR) ...................................... 07 55577

(51) Int. Cl.
*H01L 29/40* (2006.01)
(52) U.S. Cl. ................ 257/777; 257/E21.502; 257/786; 257/E21.531; 257/E23.068; 438/15; 438/124
(58) Field of Classification Search .................. 257/777, 257/786, E21.502, E21.531, E23.068, E23.116
See application file for complete search history.

(56) References Cited

U.S. PATENT DOCUMENTS

| 3,795,037 A | * | 3/1974 | Luttmer | .......................... 29/883 |
| 5,093,712 A | * | 3/1992 | Matsunaga et al. | ........... 257/786 |
| 5,280,139 A | * | 1/1994 | Suppelsa et al. | .............. 174/260 |

(Continued)

FOREIGN PATENT DOCUMENTS

DE          103 45 391 B3    2/2005

(Continued)

OTHER PUBLICATIONS

U.S. Appl. No. 12/663,349, filed Dec. 7, 2009, Baleras, et al.

(Continued)

*Primary Examiner* — Fernando L Toledo
*Assistant Examiner* — Ankush Singal
(74) *Attorney, Agent, or Firm* — Oblon, Spivak, McClelland, Maier & Neustadt, L.L.P.

(57) ABSTRACT

A method of producing an electronic connection device, including: a) formation, in a plane of a support substrate, of at least one first contact element and, in a direction approximately perpendicular to the plane, of at least one second contact element having a first end in electrical contact with the first contact element or elements and a second end, the second contact element or elements including one or more metal tracks standing up along the direction perpendicular to the surface of the substrate; b) then positioning at least one electrical or electronic component in contact with the first contact element or elements; and c) encapsulation of the component(s) and of the first and second contact elements, at least the second end or ends of the second contact element or elements being flush with the surface of the encapsulating material.

14 Claims, 9 Drawing Sheets

U.S. PATENT DOCUMENTS

| | | | |
|---|---|---|---|
| 5,353,498 A | 10/1994 | Fillion et al. | |
| 5,471,088 A * | 11/1995 | Song | 257/668 |
| 5,663,596 A | 9/1997 | Little | |
| 5,665,648 A * | 9/1997 | Little | 438/117 |
| 5,688,721 A | 11/1997 | Johnson | |
| 5,989,936 A * | 11/1999 | Smith et al. | 438/106 |
| 6,284,985 B1 * | 9/2001 | Naba et al. | 174/260 |
| 6,299,462 B1 * | 10/2001 | Biegelsen | 439/81 |
| 6,434,817 B1 * | 8/2002 | Feigenbaum et al. | 29/840 |
| 6,475,822 B2 * | 11/2002 | Eldridge et al. | 438/52 |
| 6,499,216 B1 * | 12/2002 | Fjelstad | 29/842 |
| 6,809,412 B1 * | 10/2004 | Tourino et al. | 257/678 |
| 7,230,309 B2 * | 6/2007 | Bauer et al. | 257/433 |
| 7,517,769 B2 * | 4/2009 | Van Schuylenbergh et al. | 438/381 |
| 7,579,269 B2 * | 8/2009 | Eldridge et al. | 438/618 |
| 7,601,039 B2 * | 10/2009 | Eldridge et al. | 439/894 |
| 7,635,639 B2 | 12/2009 | Val et al. | |
| 7,800,388 B2 * | 9/2010 | Hantschel et al. | 324/755.05 |
| 2002/0027019 A1 | 3/2002 | Hashimoto | |
| 2002/0055282 A1 * | 5/2002 | Eldridge et al. | 439/66 |
| 2002/0171133 A1 | 11/2002 | Mok et al. | |
| 2003/0027081 A1 * | 2/2003 | Chua et al. | 430/320 |
| 2003/0112610 A1 * | 6/2003 | Frankowsky et al. | 361/760 |
| 2003/0179064 A1 * | 9/2003 | Chua et al. | 336/200 |
| 2005/0062173 A1 | 3/2005 | Vu et al. | |
| 2005/0077632 A1 * | 4/2005 | Hedler et al. | 257/777 |
| 2005/0082679 A1 * | 4/2005 | Otremba | 257/777 |
| 2005/0184377 A1 | 8/2005 | Takeuchi et al. | |
| 2006/0057773 A1 | 3/2006 | Gross | |
| 2006/0255458 A1 * | 11/2006 | Dangelmaier | 257/735 |
| 2007/0069376 A1 * | 3/2007 | Dangelmaier et al. | 257/734 |
| 2007/0222056 A1 * | 9/2007 | Bauer et al. | 257/687 |
| 2007/0257360 A1 * | 11/2007 | Clemons et al. | 257/723 |
| 2008/0054495 A1 * | 3/2008 | Mitarai et al. | 257/787 |
| 2008/0135998 A1 * | 6/2008 | Witvrouw et al. | 257/678 |
| 2008/0169521 A1 * | 7/2008 | Foster et al. | 257/415 |

FOREIGN PATENT DOCUMENTS

| | | |
|---|---|---|
| EP | 1 596 433 A1 | 11/2005 |
| FR | 2 364 342 | 6/2005 |
| WO | WO 94/26083 | 11/1994 |
| WO | WO 03/081669 A1 | 10/2003 |
| WO | WO 2005/041295 | 5/2005 |

OTHER PUBLICATIONS

Jun Zou, et al. "Plastic Deformation Magnetic Assembly (PDMA) of Out-of-Plane Microstructures: Technology and Application", Journal of Microelectromechanical Systems, vol. 10, No. 2, XP-002470004, Jun. 2001, pp. 302-309.

Akito Yoshida, et al., "A Study on Package Stacking Process for Package-on-Package (PoP)", Electronic Components and Technology Conference, 2006, pp. 825-830.

Victor M. Lubecke, et al., "Self-Assembling MEMS Variable and Fixed RF Inductors", IEEE Transactions on Microwave Theory and Techniques, vol. 49, No. 11, Nov. 2001, pp. 2093-2098.

Gerald W. Dahlmann, et al., "Fabrication, RF characteristics and mechanical stability of self-assembled 3D microwave inductors", Sensors and Actuators A 97-98, 2002, pp. 215-220.

* cited by examiner

METHOD OF PRODUCING A VIA IN A RECONSTITUTED SUBSTRATE

TECHNICAL FIELD AND PRIOR ART

The invention relates to the field of component integration.

It proposes producing integrated component substrates, substrates that in particular contain vertical interconnections and which are suited to the formation of component stackings.

The increase in component integration density and the quest to improve performance and reduce costs lead suppliers of electronic systems to develop more and more compact devices.

Novel integration techniques are known that make it possible to increase the compactness of chips or systems while at the same time reducing their cost and maintaining their reliability.

For instance, document EP 1 596 433 describes the concept of "neo-wafers", which consists in making a wafer from tested and defined bare chips (cut electronic chips). Elementary technological steps are applied to these substrates to achieve a redistribution of the inputs/outputs of the chips so as to enable final assembly on a PCB (printed circuit).

FIG. 9 shows another type of known technique of encapsulation of a cut component 201. In this figure, the redistribution of inputs/outputs 200 may be identified at the base of the component 201, itself encapsulated in an encapsulating material 202, and the beads 204 that will serve in the assembly on a printed circuit, not represented in the figure. This technique enables the redistribution of inputs/outputs of chips. This rerouting method is directly applied to all already encapsulated functional chips.

The two techniques mentioned above further make it possible, by achieving the interconnection between chips, to produce a system at the scale of a substrate (wafer), which may comprise chips of different technologies or foundries.

In both cases, good compactness may be obtained, with a production output of around 100%.

But the integration density needs to be further improved, by using the third dimension: the stacking of components further reduces the lengths of connections and favours increases in operating frequency.

To achieve this, it is aimed to develop vertical connections inside reconstituted substrates, which the above mentioned techniques do not enable to be done.

Document US 2006/0057773 describes a method to achieve the stacking of at least two chips with an electrical connection between them. Capillaries are formed around each chip, then are metallised by sputtering of a metal layer, photolithography and electrolytic recharge.

During the stacking of the chips, the capillaries are filled with the liquid phase solder.

This technology has various drawbacks, particularly that of being developed after the positioning of the chips, but also that of being costly: it implements several steps (including 2 lithography steps), and a more or less deep etching in the material; difficulties are also posed of filling, or plugging of the vias by particles created during etching or polishing steps. Finally, the problem of end of method testability is posed: it is necessary in fact to remove the support and carry out a polishing before being able to test the continuity of the via.

Document FR 2 864 342 describes a method for interconnecting electronic components such as casings or chips, without input of brazing alloy, thereby enabling high temperature applications. It also describes an electronic device obtained by such a method. A deposition of a resin layer assures the mechanical support of the components. A surfacing of the assembly enables conducting zones of the external outputs of casings to be made to appear, for the purpose of their connection.

FIG. 10 reproduces an embodiment of this document: a simple connecting wire 302, of section of 100 μm to 200 μm thickness, makes it possible to connect a lower level to an upper level of a circuit formed on several levels. In this figure, the references 301, 303-305 designate various components, for example a casing 303, a capacitor 304, and a connector 305. These various components are transferred, by their external outputs, onto the upper face 311 of a support 310 intended to be removed later.

But this technology also poses certain difficulties:
- a vertical wire 302 needs to be maintained over the whole substrate thickness,
- there is a limitation in terms of pitch, in other words it is necessary to have available specific tooling to lay the wire 302,
- a minimum distance between the components and the wires must be respected, on account of the specific tooling for laying the components or wires.

Problems of the precision of positioning the interconnections, the implementation cost (which depends on the number of connections), the end of method testability, the locating of interconnections on the substrate, and the misalignment of the wires with each other are also posed.

Other techniques for improving the compactness are described in the prior art.

For example, in the document "A study on package stacking process for package on package (PoP)", Yoshida A. et al., 2006, ECTC IEEE conference, are described two techniques, known as "CSP" and "PoP":
- the CSP technique, illustrated in FIG. 11A, consists in stacking chips 210, making the connection between the different stages of the stacking, then encapsulating the assembly. For a system comprising more than two stages, the number of operations is relatively high, since a chip by chip assembly is then carried out. Moreover, the interconnections 211 pass systematically through the support 212 from the bottom of the stacking to avoid the crossing of wires, which implies a lengthening and an awkward placement of these interconnections,
- the PoP technique, illustrated in FIG. 11B, makes it possible to assemble uniquely tested and determined components 214, 216. But this assembly is made to the detriment of compactness and, moreover, the problem—mentioned above—remains of the interconnections brought back towards the support 215, 217 from the bottom of each stage to avoid the crossing of wires, which implies, once again, a lengthening and an awkward placing of interconnections.

The problem is thus posed of finding novel methods of producing reconstituted substrates of components or chips, in particular of the type compatible with a stacking or a 3D integration.

DESCRIPTION OF THE INVENTION

The present invention firstly relates to a method of producing an electronic device, comprising:

a) the formation, in the plane of a support substrate, of one or more first contact element(s), and, in a direction approximately perpendicular to said plane, of one or more second contact element(s) having a first end in electrical contact with the first contact element or elements, and a second end, b) then the positioning of at least one electrical or electronic component in contact with the first contact element or elements, c) the encapsulation of the component(s) and of the first and second contact element(s), at least the second end or ends of the second contact element(s) being flush with the surface of the encapsulating material.

According to the invention, one or more first contact elements are formed, such as one or more pads, which may form part of a series of tracks (horizontal rerouting) on the surface of a manufacturing support. One or more vias (second contact elements) make it possible to form a connection in a direction approximately perpendicular to the plane of the substrate. At least one part of the second contact element(s) are formed simultaneously or at the same time, or during a same step, as the first contact element(s), but before the positioning of components on this or these first contact elements and before encapsulation. This technique limits the steps of the method and thus the manufacturing cost of the device, and assures a precise positioning of the vias. The components may then be positioned and assembled on the first contact element(s); finally, an overall encapsulation of the substrate may be carried out.

The invention makes it possible to achieve a vertical rerouting of the connections of components, without forming vias in any pre-existing substrate, and particularly not in the components or through the components themselves. Moreover, it avoids bringing back the connections of the various components from their active surfaces to a plane of a support situated under these components.

Even before the positioning and the assembly of the components or chips, the electrical performance of the first and/or second contact element(s) may be checked. Defective connection zones may thus be identified and localised, and if necessary eliminated, before assembly of the components. The loss of functional chips is thereby reduced, since the risk of chips being assembled on defective connections is eliminated.

It is also possible to test the operation of the components, after their assembly on the first contact element(s) (or on the horizontal rerouting), and before the following encapsulation step. It is thereby possible to eliminate and replace defective components, which makes it possible to maintain high productivity.

Consequently, one or more step(s) of testing contact elements and/or components may advantageously be carried out before step b) and/or before step c).

The invention also relates to an electronic connection device, comprising:

a) in a plane, one or more first contact elements, and, in a direction approximately perpendicular to said plane, one or more second contact elements having a first end in electrical contact with the first contact element(s) and a second end, b) at least one electrical or electronic component in contact with the first contact element or elements, c) an encapsulation of the component(s) and of the first and second contact elements, at least the second end or ends of the second contact element or elements being flush with the surface of the encapsulating material.

At least one part of the first contact element or elements and at least one part of the second contact elements comprise a same continuous layer of conducting material.

In a method or a device according to the invention, the second contact element or elements may comprise one or more pins, made of insulating or conducting material. These pins are for example made of a conducting polymer, or a polymer filled with conducting particles, or a plastic material. They are covered, completely or at least in part, with a conducting layer.

According to a specific embodiment, the pin or pins may be formed directly on the first contact elements or metal tracks of a horizontal rerouting. A metallisation makes it possible to connect them in one step to the first contact elements, to obtain the three-dimensional rerouting. The following steps then follow on: installing components and encapsulation.

In an alternative, the second contact element or elements comprise metal tracks or beams or arms formed horizontally, or parallel to the surface of the substrate, or a stacking of at least two layers, forming bimetallic element, are then made to stand up along said direction perpendicular to this surface, for example by mechanical effect or under the action of an applied force such as a force of magnetic origin.

The metal tracks or beams or arms are liberated, from the substrate or from a plane parallel to the substrate and are at least partially made to stand up in a direction approximately perpendicular to the support substrate. The result may be, after being made to stand up, a curvature of these tracks or beams or arms.

According to one embodiment, these metal tracks or beams or arms, for example a bimetallic element, are formed on a sacrificial layer that is then removed. There is a mechanical standing up, at least partial, of the tracks or beams or arms, along a direction perpendicular to the substrate, during the removal of the sacrificial layer.

According to another embodiment, these metal tracks or beams or arms are at least in part magnetic, and are made to stand up at least partially under the action of a magnetic field after the removal of the sacrificial layer.

In both cases, the second contact element or elements to be made to stand up are brought, from a position parallel to the substrate, to a direction vertical or perpendicular to the substrate. But, once again, these elements may have a certain curvature in their standing up part.

A method according to the invention may comprise the formation of one or more circuits (horizontal rerouting circuits) in the plane of the support substrate, of which the first contact element or elements form part.

The support substrate may be removed, in which case the face that it leaves free may be covered with a passivation layer, on which a series of connections may be elaborated. The substrate may however be maintained if, for example, it is an active support or a substrate transparent in a certain range of wavelengths (one of the components comprising an optical function).

After step a) and before step c), a frame may be positioned, in order to delimit filling zones, comprising several compartments in each of which is positioned at least one component.

The invention also relates to a method of producing a compact electronic device, comprising the formation of at least one first device such as above, and a stacking of this device with a second device, if necessary also obtained by a method according to the invention.

DETAILED DESCRIPTION OF SPECIFIC EMBODIMENTS

Examples of components obtained by a method according to the invention will be described below, in particular with reference to FIGS. 4-8; but examples of methods of producing these components will be detailed beforehand.

A first example of an embodiment according to the invention is given with reference to FIGS. 1A-1J.

In this example, a "vertical" pre-routing, in other words in a direction perpendicular to a substrate 2, comprises pins 4, of substantially cylindrical or trunconical shape. These pins may be insulating or conducting and are provided with a metallised coating 11.

The dimensions of the pins can vary in the following range: height between 100 μm and 1 mm, for a diameter between 20 μm and 100 μm; for example the pins have a height of 100 μm for a diameter of 20 μm, or a height of 1 mm for a diameter of 100 μm. It is also possible to have smaller dimensions if the chips are thinned. For example, if the chips are of 50 μm thickness, metal pins (by electrolytic growth of copper through a photosensitive resin) of 60 μm to 80 μm equivalent diameter may be formed.

In a first step (FIGS. 1A and 1B), these pins 4 are formed on a same side of a support 2, for example made of glass or quartz. Other types of substrate are possible, in particular active substrates.

These pins 4 have an aspect ratio (and particularly a h/d ratio, between their height and their average transversal dimension or their average diameter), such that they will be able to assure the function of connections or conducting vias, while at the same time occupying a minimum surface on the plane of the substrate 2 on which they are positioned or formed and while assuring the requisite stiffness in the plane of the figure and/or perpendicular to this plane.

These pins may be made of plastic material, or a conducting polymer, or a charged polymer, or any other conducting material. They will be covered with a conducting layer.

Figure 3:
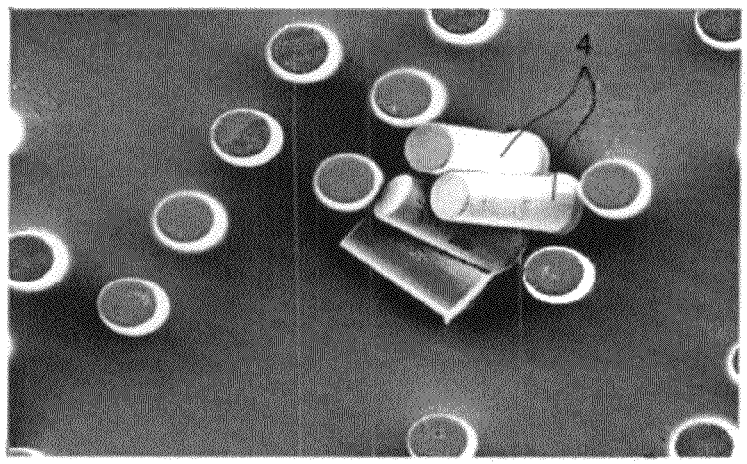
FIG. 3 presents examples of polymer pins that may be used within the scope of the present invention.

FIG. 3 represents a photograph of such polymer pins 4. These pins may be obtained by photolithography of a resin (Su8 for example) on the support substrate 2.

More generally, different methods may be implemented for the manufacture of these pins: moulding, photolithography, metal injection moulding type method, transfer of conducting beads, etc.

Then (FIG. 1C), a continuous base 6 of a conducting layer (for the purpose of an electrolytic growth) such as TiCu is deposited (for example by sputtering). This layer covers the whole of the substrate, both the pins 4 and the zones 3 (on the surface 5 of the support 2) situated between the pins.

By a technique such as photolithography, patterns 8 are formed (FIG. 1D) that will make it possible to delimit, during the following step, the formation of a rerouting or a series of conducting tracks on the surface of the substrate 2. These patterns may be made of resin, deposited for example by spray.

Figure 1A:
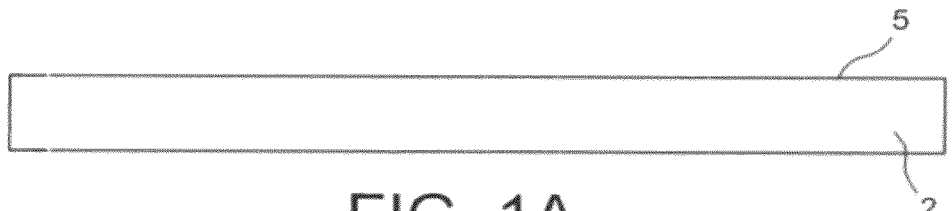
FIGS. 1A-1J represent a first embodiment of a method according to the invention.
Figure 1B:
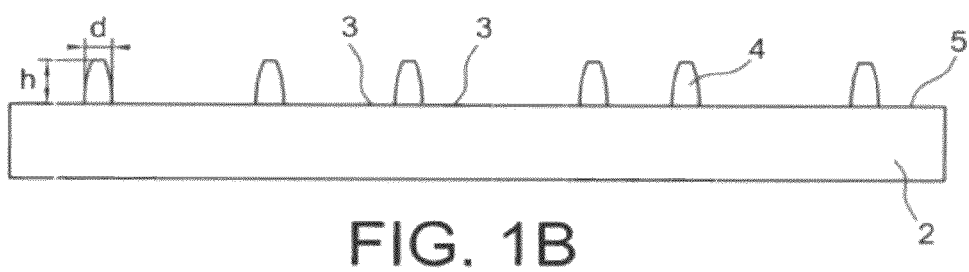
Figure 1C:
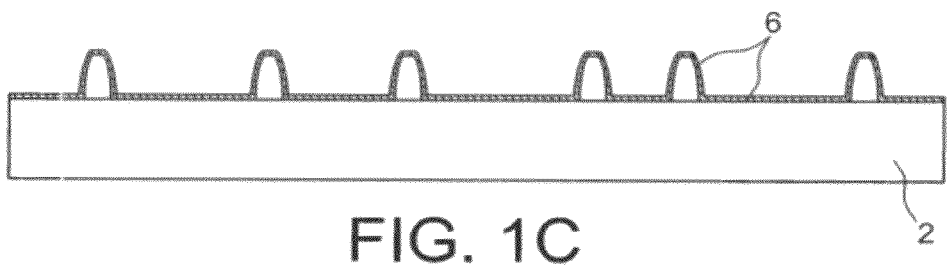
Figure 1D:
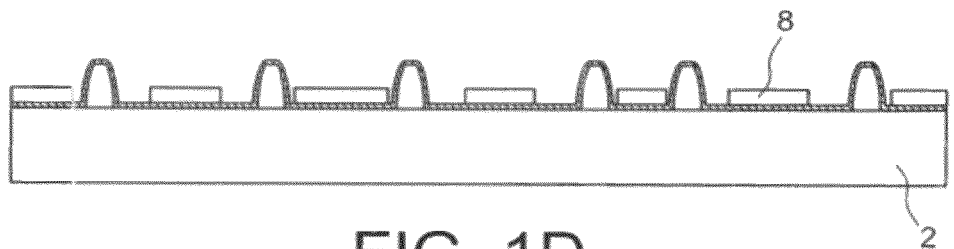
Figure 1E:
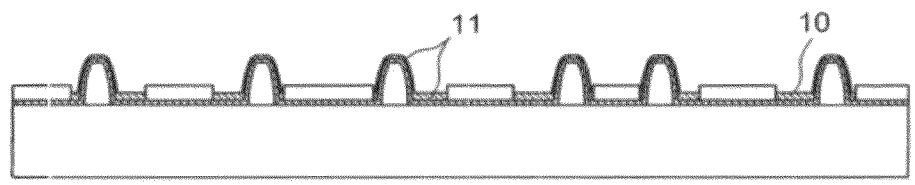
Figure 1F:
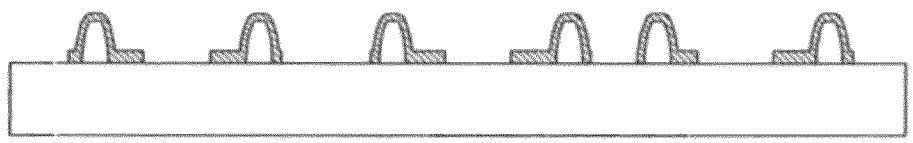
Figure 1G:
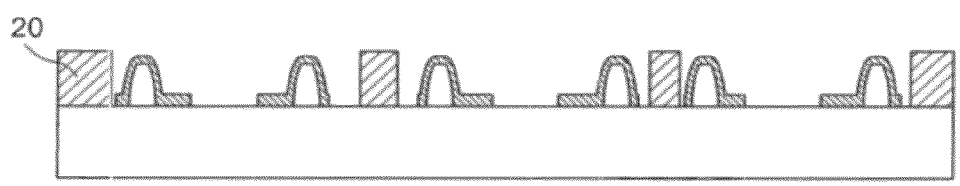
Figure 1H:
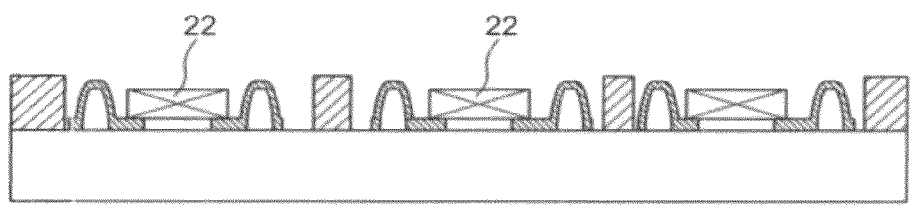

During the following step (FIG. 1E) is thus formed this "horizontal" rerouting or rerouting on the surface 5 of the support substrate 2 or the layer 6. Forming part of this horizontal rerouting are in particular the conductor pads 10, for example made of copper, which will make it possible to position the components during a subsequent step. In FIG. 1E only the pads 10 are shown, but the horizontal rerouting may comprise in fact a complex system of tracks and connections on the support substrate, including in the plane perpendicular to that of the figure. The technique used for the formation of this rerouting is for example an electrolytic growth technique.

During a same operation, for example of deposition, it is possible to form, if necessary simultaneously, a same conducting coating 11 on at least one part of the first contact elements 10, or even forming these first contact elements 10, and at least one part of the second contact elements (pins). These first and second contact elements comprise this conducting coating.

In this way is formed at the same time, or simultaneously or during a same step, or in any case before assembly of the components or chips, the "horizontal" rerouting, including the pads 10 (first contact elements), the pins, and the electrical contact between this horizontal rerouting or these pads and these pins (second contact elements). The conductor pads 10, formed on the surface of the layer 6 or the substrate 2, are adapted to receive, during a later step, components 22.

The pins may be formed after the formation of the tracks or the horizontal rerouting and particularly the pads 10. For example, since the resin Su8 (conducting or not) is a photosensitive resin, pins are formed on the tracks. If the material is not conducting, steps to metallise the pins are added. It is possible to form, once again, by a same operation, a same conducting coating 11 on at least one part of the first contact elements 10 and at least one part of the second contact elements (pins). If necessary, and as represented in FIG. 1E, the same conducting coating 11 entirely covers the first contact elements 10 and the second contact elements 4.

By the method exposed above at least one part of the first contact elements 10 and at least one part of the second contact elements 4 comprise a same continuous layer 11 of conducting material.

The resin 8 is then removed (FIG. 1F) and the continuous base 6 is etched, leaving remaining the horizontal, or flat, rerouting and in particular the conductor pads 10, as well as the pins 4 with which these pads are in electrical contact. These pins constitute vias, which make it possible to redirect the electrical contacts from conductor pads 10 in at least a direction z perpendicular to the plane xOy defined by the surface 5 of the support 2. At this stage, tests on the rerouting tracks and pins may be carried out. Even before the positioning of the components, it is thus possible to identify deficient tracks or contact zones, if necessary repair them, and otherwise then avoid using them for components.

It is then possible to bond or lay out a frame or a lattice 20 to delimit filling zones. For example, it is possible to bond a frame and fill the overall cavity or place a lattice and fill the different cavities. The positioning of the frame or the lattice may take place after assembly of the chips.

Components or chips 22 are assembled (by insulating, or conducting, bonding or by thermo-compression, etc) in contact with the pads 10. There is then contact, on the one hand, between these components and the pads 10, and, on the other hand, between said pads and the pins 4. Depending on the method of assembly of the components, step of metallising the chips 22 may if necessary be added for the re-growth of contacts on the pads 10.

Figure 1I:
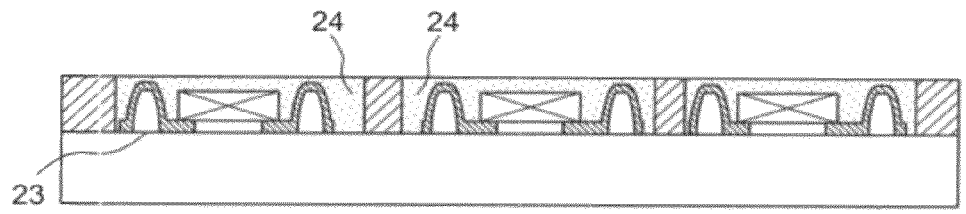

The assembly may then be covered, for example by filling the cavities or the zones formed by the frame 20, with an encapsulating material 24, such as an epoxy type resin (FIG. 1I).

Figure 1J:
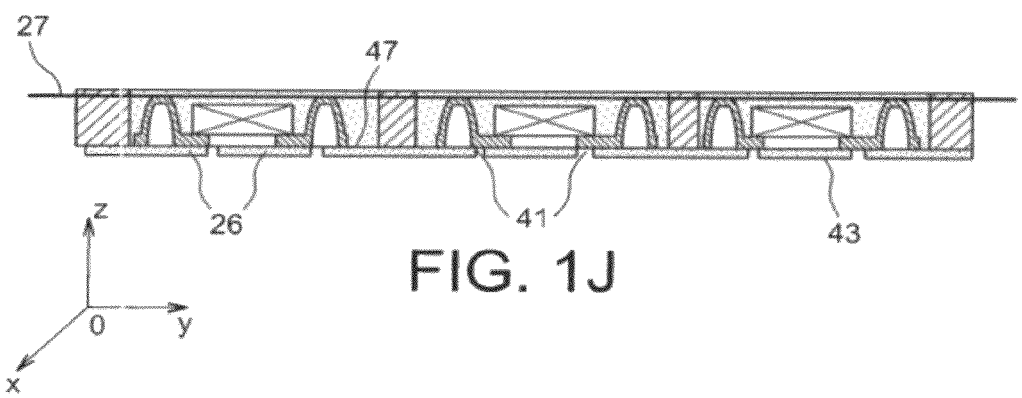
Figure 7:
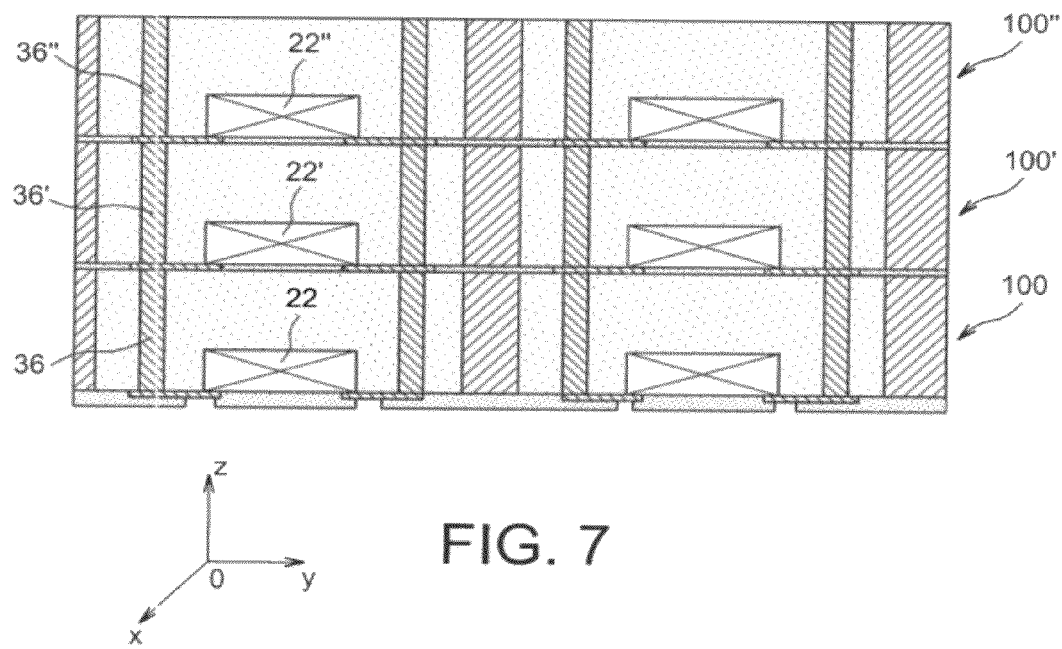
FIGS. 7 and 8 represent assemblies of devices obtained by a method according to the invention.
Figure 8:
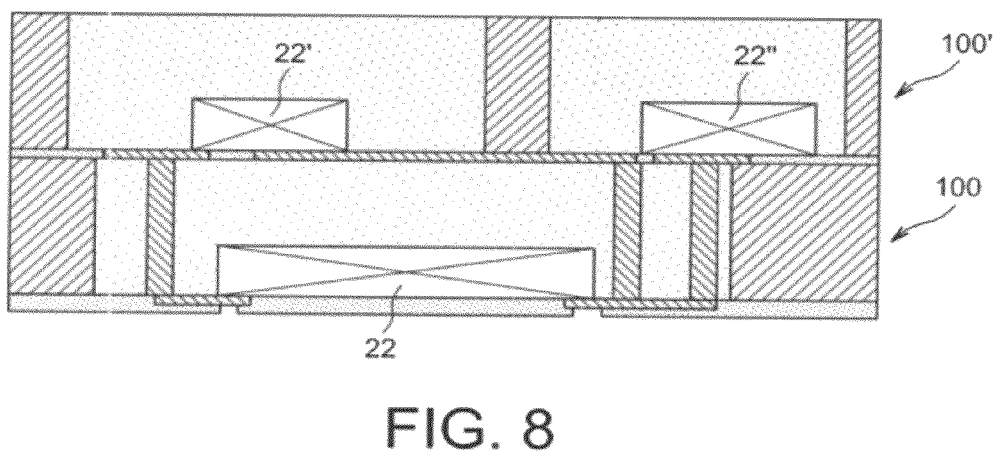
Figure 9:
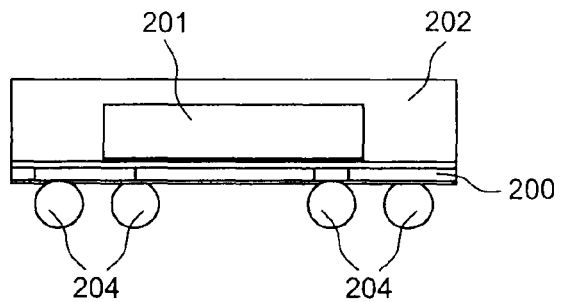
FIGS. 9, 10, 11A and 11B represent structures known from the prior art.
Figure 10:
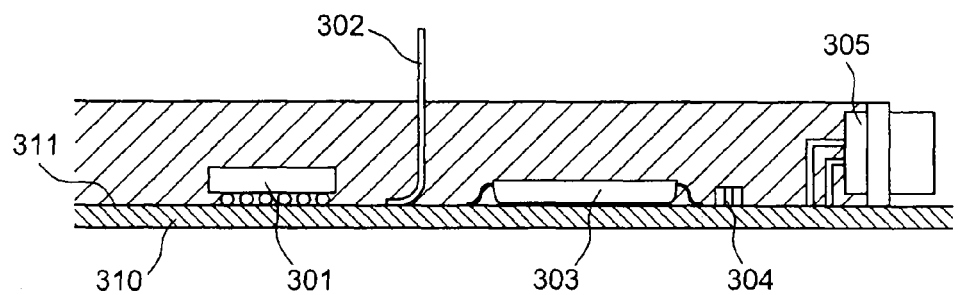

A thinning or a surfacing of the assembly makes it possible to take back the upper encapsulation surface to the level of a plane 27, which makes conducting zones appear corresponding to the upper end of the metallised or metal pins 4 (FIG. 1J). In this way are formed a connection surface, in which the conducting zones formed by the upper metallised or metal ends of the pins are flush. This connection surface will make it possible, subsequently, to accommodate, for example an additional stage of components for the purpose of forming a stacking, as illustrated in FIGS. 7 and 8.

The pins may serve as control for the thinning depth. For example, their appearance is observed at certain altitudes in the substrate or one or more profiles of pins are formed that make it possible, thanks to a dimensional measurement, to know the depth of the thinning. More generally, a device produced according to the invention may comprise patterns for controlling the depth of thinning the encapsulating material; the appearance of patterns may thus be observed at certain altitudes in the encapsulation, or instead pattern profiles may be formed that enable, thanks to a dimensional measurement, the depth of the thinning of the encapsulation to be known.

Finally, the disbondment of the support 2 and a passivation of the surface 23, left free by the removal of the support substrate, and defined by the base of the pins 4, pads 10, and if necessary by the base of the horizontal rerouting and/or lower part of the encapsulating material situated under the components 22 are carried out. A layer of photosensitive dielectric material 26 (FIG. 1J) may in particular be formed on this surface. Openings 41 may be etched in it, from which it will be possible to establish other connections, for example from a first component 22 to a second situated in the same plane as the first, or between two stages of stacked devices, as illustrated in FIG. 7. For example, these external connections, or this rear rerouting, are formed by a step of metallisation on the face 43 of the layer 26 opposite to the face 47 of this same layer turned towards the components 22. The vias formed by the pins 4 may serve as alignment patterns for photolithography steps on this face 43.

A second manufacturing example according to the invention is given with reference to FIGS. 2A-2I.

In this example, the vertical contact elements are firstly formed horizontally, then raised by the effect of stresses, for example internal mechanical stresses or under the effect of an external magnetic field.

In a first step (FIG. 2A), a sacrificial layer 30 is deposited on a support 2 for example made of glass or quartz. This layer 30 is for example made of silicon oxide $SiO_2$ or photosensitive resin or photosensitive polymer, or polyimide.

Figure 2A:
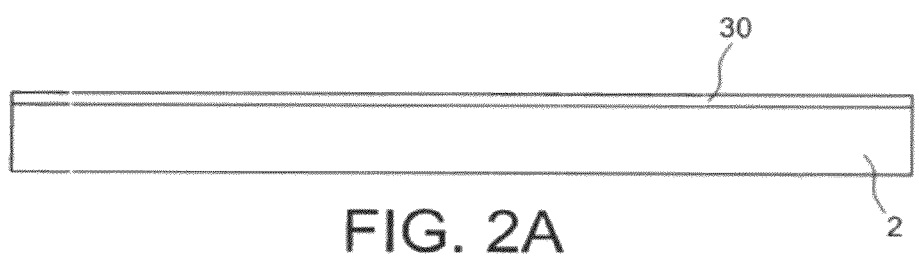
FIGS. 2A-2I represent a second embodiment of a method according to the invention.
Figure 2B:
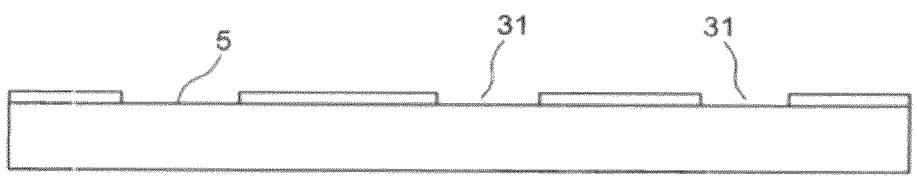

By a technique such as photolithography, openings 31 are delimited in this sacrificial layer (FIG. 2B).

A bimetallic element is then made (beam constituted of at least two materials, the thermal expansion coefficients of which are different to each other; the same effect may also be obtained if the materials are deposited at different temperatures) by deposition of several materials 34, 36 (for example polysilicon/CrAu). A first part 34 is formed on the surface 5 of the substrate 2, in the edge zones (but inside) of the openings 31. A second part 36 is formed partially in contact with the first part 34 and partially on the sacrificial layer 30.

For example, the layers of materials 36 and 34 are deposited, simultaneously or during a same step, respectively on the sacrificial layer 30 and on the surface 5; then the beam is formed by an operation of lithography and by etchings of the layers 36 and 34 (these steps are not illustrated in FIGS. 2A-2I). The beam thus comprises a part on the sacrificial layer 30 and a part fixed on the surface 5 of the support.

In terms of dimensions, it is possible for example to have a layer 30 made of $SiO_2$, of around 2 μm thickness, deposited by PECVD, a thickness of polysilicon 34 of 1.5 μm and a thickness 36 of CrAu of 0.5 μm.

As regards the choice of materials: the beam is for example constituted of a conducting layer (Au,Al,Ti) and a layer 34 having good mechanical properties (oxide, nitride, polysilicon, etc.)

Figure 2C:
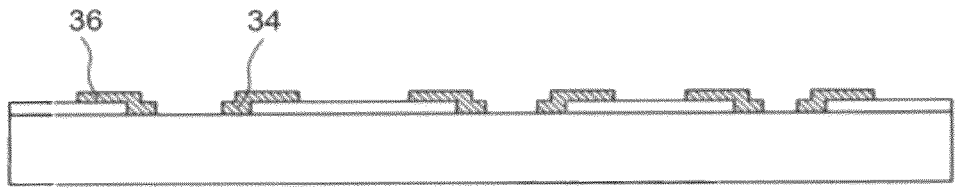

In FIG. 2C and following figures, only pads of the first part 34, formed on the surface 5 of the substrate 2, appear. In fact, it is possible to form during this step a horizontal rerouting, on the surface 5, comprising a complex system of tracks and connections, in the plane of this surface, perpendicular to the plane of the figure.

This technique thus makes it possible to form, once again, by a same deposition operation, at least one part of the first contact elements 34 and at least one part of the second contact elements 36. The first contact elements and the second contact elements comprise a same continuous layer of conducting material.

The sacrificial layer 30 (FIG. 2D), and particularly the parts of this layer situated under the second parts 36 of material of the bimetallic element, is then removed. An effect of release or standing up of the bimetallic element is then produced, an effect stemming from mechanical stresses of the layers. In this way are formed tracks having at least a direction perpendicular to the surface 5, to the plane of the substrate and to the plane in which the bimetallic element has been initially deposited. Such a standing up effect is explained in particular in the article of Victor M. Lubecke et al., "Self-assembling MEMS variable and fixed RF inductors", published in IEEE Transactions on Microwave Theory and Techniques, vol. 49, no 11, November 2001, pages 2093-2098. In this article, the standing up effect is applied to the production of RF inductors, but the same effect may be obtained for any beam or for any arm obtained from a bimetallic element formed on a sacrificial layer such as the layer 30. The article of G. W. Dahlmann et al., which appeared in Sensors and Actuators A, 97-98, p. 215-220, 2002 may also be cited as regards this technique.

Figure 2D:
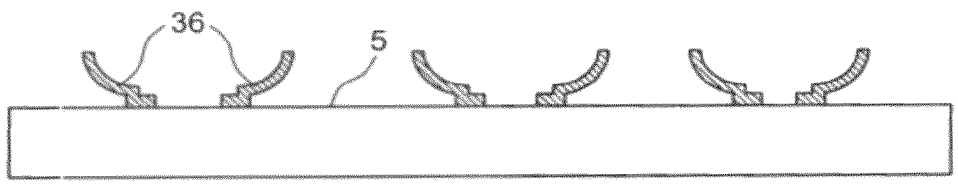

This standing up effect leads to the structure of FIG. 2D, where the electrodes 36 are maintained, under the effect of stresses, above the surface 5 of the substrate 2, each having a curved shape directed from the side opposite to the substrate 2. On the side of the substrate 2, these electrodes are connected to the horizontal rerouting formed on the plane 5, and particularly to the pads 34.

According to another embodiment, the beam is in part constituted of a magnetic material or comprises at least a magnetic coating. For example, it is made of Au and is coated with a "permalloy" type magnetic material. After removal of the sacrificial layer 30, this beam may be made to stand up by the application of a magnetic field, as explained in the article of J. Zou et al. "Plastic Deformation assembly of out plane microstructures: technology and applications", Journal of Microelectromechanical Systems, vol. 10, no 2, June 2001, page 302-309.

Figure 2E:
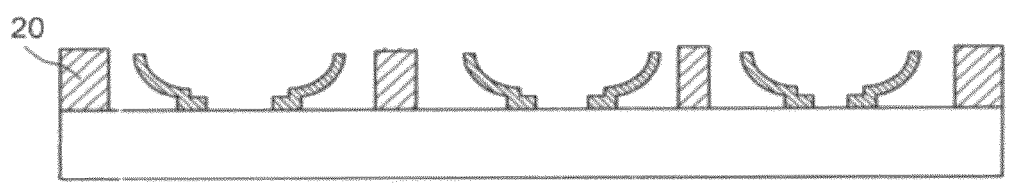

A frame 20 may then be bonded to delimit filling zones (FIG. 2E). The positioning of the frame may take place after assembly of the chips.

Figure 2F:
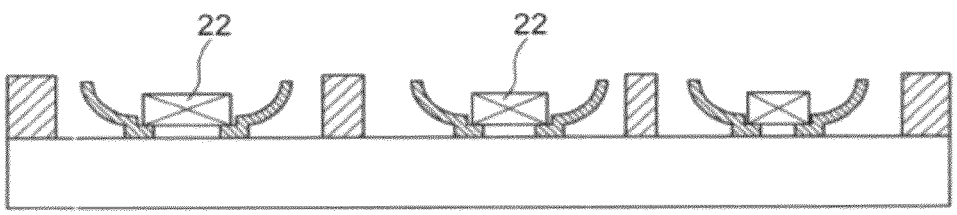

Chips 22 may then be assembled, for example by insulating, or conducting, bonding or by thermo-compression, in contact with the parts 34 of the horizontal rerouting forming contact pads on the surface 5 of the substrate 2 (FIG. 2F).

In the case of the assembly of chips with an insulating adhesive, conducting elements are used, on the pads of the chip, which transfix the adhesive (for example metal inserts or "bumps"). By the effect of the pressure or the thermo-compression of the chip, the electrical contacts are obtained. Anisotropic conducting adhesives may also be used, the vertical electric conductivity being obtained during the thermo-compression. A conducting adhesive may also be deposited at the pads of the chip.

A re-growth of contacts may be obtained by metallisation of the chips 22. These chips or components are thus, through this assembly, connected to the pads, and if necessary to the horizontal rerouting tracks, but also to the electrodes 36 forming vertical rerouting.

Figure 2G:
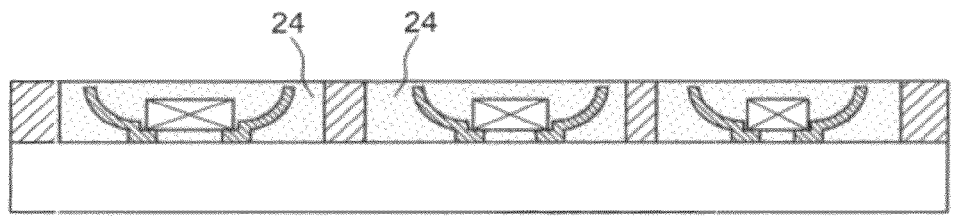
Figure 2H:
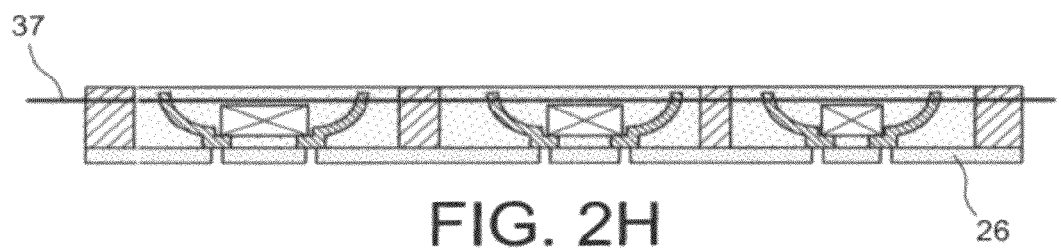

The assembly may then be covered, for example by filling the cavities formed by the frames 20 with an encapsulating material 24, such as an epoxy type resin (FIG. 2G).

A thinning or a surfacing of the assembly enables the encapsulation to be taken back to the level of a plane 37, which makes conducting zones corresponding to the upper end of the beams or arms 36 (FIG. 2H) appear. A connection surface has thus been formed, in which appear, in the encapsulating material 24, conducting zones formed by the metallised upper ends of the arms or beams 36. This connection surface will later make it possible to accommodate, for example, an additional stage for the purpose of forming a stacking, as illustrated in FIGS. 7 and 8.

Figure 2I:
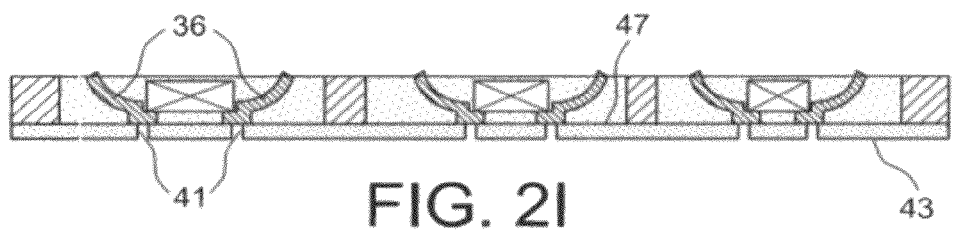

Finally may be carried out the disbondment of the support 2 and a passivation of the surface 23, left free by the removal of the support substrate, defined by the base of the pins 4, pads 10, and if necessary by the base of the horizontal rerouting and/or the lower part of the encapsulating material situated below the components 22. A photosensitive dielectric layer 26 may in particular be formed on this surface (FIG. 2I). Openings 41 may be etched on it, from which it will be possible to establish other connections, for example from a first component 22 to a second situated in the same plane as the first, or between two stages of stacked devices, as illustrated in FIG. 7. For example, these external connections, or this rear rerouting, are formed by a step of metallisation on the face 43 of the layer 26 opposite to the face 47 of this same layer turned towards the components 22.

In the two methods described above, the formation, simultaneously or during the same step, of at least one part of the first and second contact elements, (horizontal rerouting and vertical vias) before positioning of the components, enables tests to be carried out on these contact elements. Thus it is possible to carry out these tests between the steps of FIGS. 1G and 1H, or between the steps of FIGS. 2E and 2F. The identification of a defective connection will enable its repair or, in any case, will enable a zone where a component 22 should not be placed to be identified.

In the same way, during a later step, after the components 22 have been installed, it is possible to carry out a test of the "connection means+components" assembly. Such a test may for example be carried out at the end of the steps corresponding to FIGS. 1H and 2F above.

The removal of the substrate 2, after the steps of FIGS. 1J and 2I, is not systematic: thus in the case of electro-optic or optronic components 22, the substrate 2 may be transparent in a certain range of wavelengths and be maintained, at least in part. It may be, also, that the support 2 is active: it is then for example, a substrate made of a semi-conducting material, such as silicon, provided with functions or components.

Figure 5A:
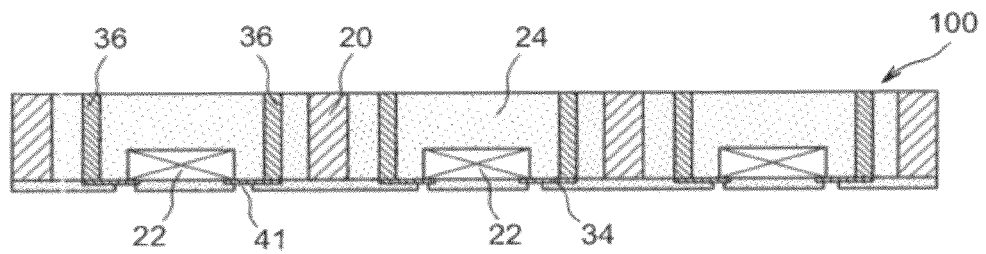
Figure 5B:
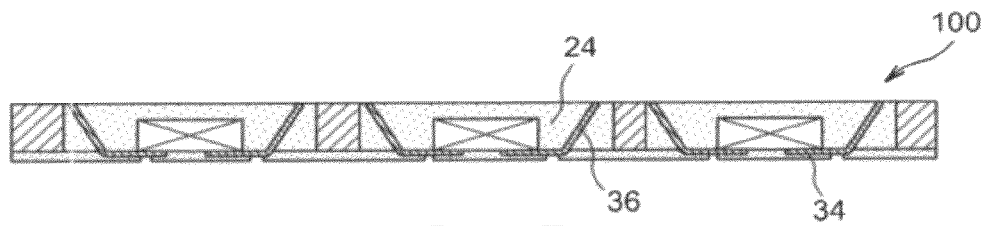
Figure 5C:
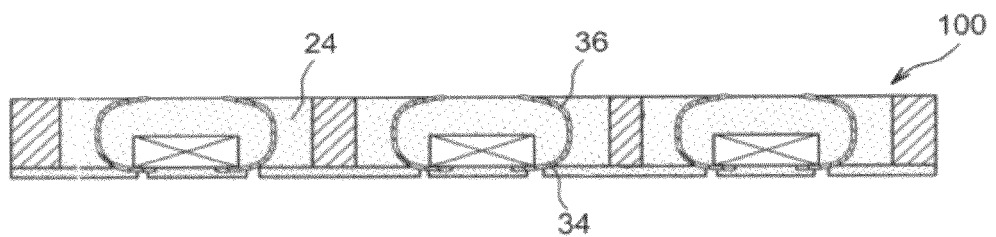

FIGS. 4 and 5A-5C represent various connection devices 100, each being obtained by a method according to the invention. In these devices, the substrate 2 has been removed. The components 22 are however very thin (their thickness e is highly exaggerated in the figures, for reasons of legibility) and they define as well the plane xOy, as does moreover the horizontal rerouting, which has been formed on the surface 5. In these FIGS. 4 and 5A-5C, numerical references identical to those of the preceding figures are used again, which designate similar or identical technical elements. In the cases illustrated, the components 22, encapsulated in an encapsulating material 24, are connected to a rerouting in the plane xOy of the initial substrate. In these figures, only connection pads 10, 34, are visible, but the rerouting may further comprise various tracks and other pads in this plane of the initial substrate. To these connection pads are also connected conducting elements, or vias, which will make it possible to orient the connection along the direction z, perpendicular to the plane xOy. In the examples of FIGS. 5A-5C, these conducting elements essentially comprise beams or arms 36, made to stand up to various degrees; in the case of FIG. 5C, the conducting elements situated outside of the plane xOy are even highly curved, up to bringing their free end back above the component. In the other case (FIG. 4), they are pins 4 covered by a metallisation as explained above. In all cases, a rerouting is made in a direction z perpendicular to the plane of the initial substrate 2 or to the plane, defined by the components 22 and in which they are formed.

In the examples presented in the figures, two vias are laid out, in a symmetrical manner, on either side of each component 22.

Figure 6A:
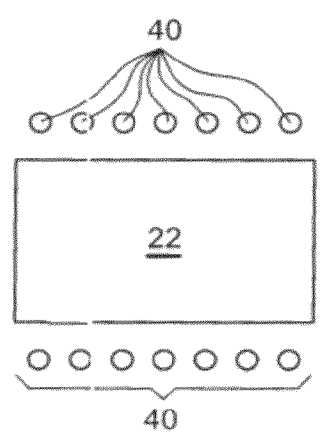
FIGS. 6A-6C schematically represent various layout examples of a component and vias near to this component.
Figure 6B:
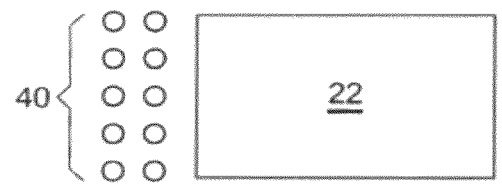
Figure 6C:
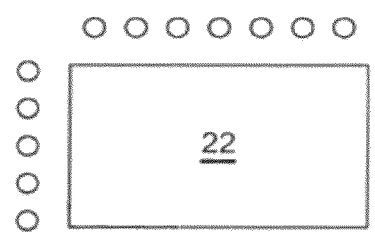
Figure 4:
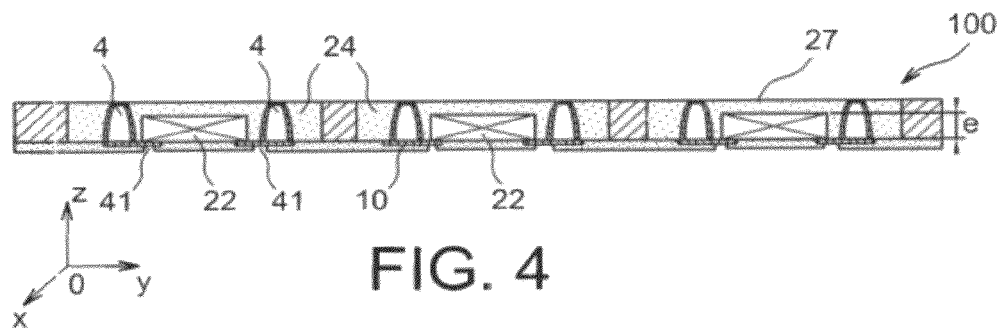
FIGS. 4 and 5A-5C represent devices obtained by a method according to the invention.

However, other numbers of vias and other lay outs of vias are possible. FIGS. 6A, 6B and 6C schematically represent, in top view, a component 22, and one or several series 40 of vias laid out on either side of the component (FIG. 6A), or on a single side of the component (FIG. 6B), or on two sides of the component but not necessarily in a symmetrical manner (FIG. 6C). These lay outs of vias are not exhaustive: other lay outs may be formed, combining for example several of the lay outs of vias represented in FIGS. 6A-6C. In these diagrams, the horizontal rerouting tracks and pads are not represented, but can, as well, have any requisite shape or lay out during the conception.

Figure 11A:
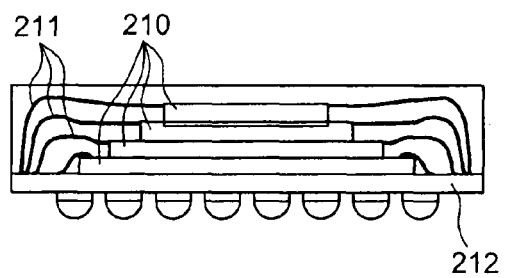
Figure 11B:
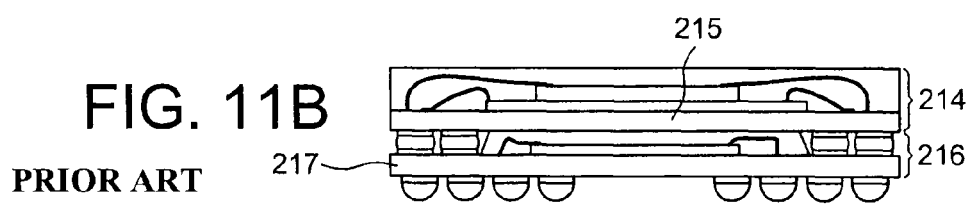

In all of the embodiments of the invention presented, the electrodes are directed in a direction approximately perpendicular to the plane of the initial substrate 2—even if they may have a certain curvature as in FIGS. 5A-5C—and without being brought back under this plane, to a lower support substrate on which the chips or the components would lie (which is the case of FIGS. 11A and 11B).

As illustrated in FIG. 7, a plurality of these connection elements 100, 100', 100" according to the invention may be used to form a stacking of components. From this figure it clearly appears that the different levels of the stacking are in electrical contact with each other by means of vias 36, 36', 36" laid out along the direction z. In this figure, only vias of the type of those obtained with reference to the second method are represented, but it would also be possible to have "pin" type vias, like those of FIG. 4, or instead an assembly of elements comprising vias of both types.

The invention may thus be employed to produce a complex system from components derived from different wafers.

More complex structures than those of FIG. 7 may be elaborated, for example, of the type illustrated in FIG. 8, in which only two levels of components 100, 100' are represented, but grouping together, in a same assembly (made at the scale of a wafer or substrate), an ASIC 22, a MEMS 22' and a RFID component 22".

It is also possible to assemble a stage comprising a substrate reconstituted according to the invention and a stage of another nature, not obtained by a method according to the invention.

One of the applications of the invention is in particular the production of high speed memory modules, favoured by the short length of the tracks, which results itself from the vertical rerouting.

The invention claimed is:

1. A method of producing an electronic connection device, comprising:
   a) forming, in a plane of a support substrate, at least one first contact element, and, in a direction approximately perpendicular to the plane, at least one second contact element including a first end in electrical contact with the at least one first contact element and a second end, said forming including liberating and standing up the at least one second contact element, which includes at least one metal track, or beam or arm, from a position parallel to the support substrate, to extend in the direction approximately perpendicular to the plane;
   b) then positioning at least one electrical or electronic component in contact with the at least one first contact element; and
   c) encapsulating, with an encapsulating material, the at least one electrical or electronic component and the at least one first and second contact elements, at least one second end of the at least one second contact element being flush with a surface of the encapsulating material.

2. The method according to claim 1, further comprising:
   forming, during a same operation, at least one part of the at least one first contact element and at least one part of the at least one second contact element.

3. The method according to claim 1, wherein the at least one second contact element includes a stacking of at least two layers forming a bimetallic element.

4. The method according to claim 1, further comprising:
   making the at least one metal track, or beam or arm stand up by mechanical effect, by magnetic effect, or at least in part by magnetic effect.

5. The method according to claim 1, further comprising:
   forming the at least one metal track, or beam or arm on a sacrificial layer; and removing the sacrificial layer.

6. The method according to claim 1, further comprising forming at least one circuit in the plane of the support substrate, of which the at least one first contact element forms part.

7. The method according to claim 1, further comprising at least one of testing contact elements, before the positioning b) and testing components, before the encapsulating c).

8. The method according to claim 1, further comprising removing the support substrate.

9. The method according to claim 1, wherein the support substrate is transparent in a certain range of wavelengths, or is an active support.

10. The method according to claim 1, further comprising, after the forming a) and before the encapsulation c), positioning a frame for delimiting filling zones, including plural compartments in each of which is positioned at least one component.

11. A method of producing a compact electronic device, comprising:
    forming the electronic connection device according to claim 1; and
    stacking the electronic connection device with another electronic connection device.

12. The method according to claim 1, wherein the direction is perpendicular to the plane.

13. The method according to claim 8, further comprising forming a passivation layer of a face left free by the removing the support substrate.

14. The method according to claim 13, further comprising forming electrical connections on the passivation layer.

* * * * *